United States Patent [19]
Lancaster et al.

[11] Patent Number: 5,510,638
[45] Date of Patent: Apr. 23, 1996

[54] FIELD SHIELD ISOLATED EPROM

[75] Inventors: Loren T. Lancaster; Ryan T. Hirose, both of Colorado Springs, Colo.

[73] Assignee: NVX Corporation, Colorado Springs, Colo.

[21] Appl. No.: 234,288

[22] Filed: Apr. 28, 1994

Related U.S. Application Data

[63] Continuation-in-part of PCT/US93/10485, Nov. 2, 1993, which is a continuation-in-part of Ser. No. 970,921, Nov. 2, 1992, abandoned.

[51] Int. Cl.$^6$ .................................................. H01L 27/115
[52] U.S. Cl. ........................... 257/314; 257/394; 257/630
[58] Field of Search .................................. 257/394, 630, 257/316–326, 314, 315

[56] References Cited

U.S. PATENT DOCUMENTS

| | | | |
|---|---|---|---|
| 3,811,076 | 5/1974 | Smith | 257/394 |
| 3,846,768 | 11/1974 | Krick | 257/324 |
| 5,111,257 | 5/1992 | Andoh et al. | 257/630 |

*Primary Examiner*—William D. Larkins
*Attorney, Agent, or Firm*—Richard A. Bachand; Holland & Hart

[57] ABSTRACT

A transistor structure (10), memory array (150) using the transistor structure, and method for making it are presented.

The memory array (150), on a semiconductor substrate (152), contains a plurality of substantially parallel bit lines (154,155). A plurality of channel regions in the substrate (152) are bounded in one direction by a sets of bit line pairs (154,155). A conductive field shield layer (160), over a first insulation layer (156), is patterned to provide electrical regions over the channel regions between the first alternate sets of the bit lines (154,155) to form isolation transistor structures when biased with respect to the substrate (152). The field shield layer (160) is patterned to expose the channel regions of the memory transistors (151, . . . , 151''') between second alternate sets of the bit lines (155,154). A second insulating layer (163) is formed over the field shield layer (160). A nonvolatile memory dielectric layer (165) is formed over the channel regions between the second alternate sets of the bit lines (155,154). A conductive gate layer (166), patterned to provide a plurality of stripes, extends across the channel regions of the second alternate sets of bit lines (155,154). In one embodiment, the electrical regions patterned from the conductive field shield layer are a plurality of substantially parallel stripes overlying the channel regions between the first alternate sets of the bit lines, and may additionally overlie at least a portion of the bit lines of the first alternate sets of the bit lines. The plurality of stripes of the conductive gate layer are preferably substantially orthogonal to the parallel field shield stripes. In another embodiment, the field shield layer is substantially self aligned with the channel regions of the second alternate sets of bit lines in a direction orthogonal to the direction of current flow in the channels of the memory transistors (151, . . . ,151''').

22 Claims, 6 Drawing Sheets

FIELD SHIELD ISOLATED EPROM

CROSS-REFERENCE TO RELATED APPLICATION

This is a continuation-in-part of our PCT patent application Ser. No. PCT/US93/10485, filed Nov. 2, 1993, which is a continuation-in-part of our U.S. patent application Ser. No. 07/970,921, filed Nov. 2, 1992, now abandoned.

BACKGROUND OF THE INVENTION

1. Field of the Invention

This invention relates to improvements in non-volatile dielectric memory cell devices and methods for operating such devices, and more particularly to improvements in scalable non-volatile dielectric memory cell device construction and biasing circuitry used therein, and to methods for reducing disturb conditions when reading, erasing, or programming non-volatile dielectric memory cells.

2. Relevant Background

Nonvolatile memory cells of the type in which a dielectric body is configured to exhibit an electric field between the channel and gate of a field effect transistor (FET) device are becoming of increased interest. In such memory cells, although various storage mechanisms may be provided by different known dielectric materials, generally, various physical or electrical changes may be selectively programmed into the cell dielectric which result in electric fields that control a current flow in the channel of the memory transistor when the cell is addressed. Usually, individual memory cells are programmed and erased by applying particular programming voltages, often much higher than normal operating read voltages, between the gate and the source, drain, and substrate of the cell transistors. Once the cell has been programmed, a current flow induced in the channel is measurably influenced by the field produced by the dielectric, sensed by various known sensing techniques, and interpreted as a logical one or zero.

One of the major problems prior art cells have experienced is a so-called "read disturb" condition. A "disturb" is condition that diminishes the quality of the data in the cell, or in some cases, actually changes the data held in the dielectric. Disturb conditions occur primarily when a cell is read, although disturbs can occur whenever a memory array is addressed. Read disturb effects are generally only slight for each read event on any particular cell, but, in the past, read events cumulatively operate to change the information stored in the dielectric material of the cell, resulting particularly in an erased cell appearing as if it had been programmed or a programmed cell appearing as if it had been erased. A disturb condition of this proportion renders the cell, or an array in which it is embodied, virtually useless, since the number of times any cell can be read is limited.

The effects of disturb conditions are generally more widespread in a memory array than merely the particular cells being addressed. Since memory cells in most memory array constructions share some common interconnecting lines, read voltages to read a specific addressed cell are often also applied to at least some elements of adjacent and nearby cells. These unwanted voltages also may tend to create read disturb problems on the non-addressed cells, as well.

In some applications, to address these read disturb problems, multiple transistors have been employed in each memory cell to isolate the memory transistor of the cell from unintended voltages, especially when common interconnecting lines may be employed. Typically, in multiple transistor arrangements, each memory cell has three transistors, with an isolating transistor located both above and below the memory transistor. In fact, such upper isolation transistor typically may be used to select the memory cell transistor when it is addressed in order to isolate the selection voltages from the gate of the memory cell transistor itself to minimize the possibilities of read disturb events.

Although multiple transistors are widely used for voltage isolation, recently single cell nonvolatile dielectric memory arrays have been proposed. The single memory cells are addressed in read operations by an increased voltage, on the order of twice the magnitude of a supply voltage, $V_{cc}$, applied to the drain of the memory transistor, with $V_{cc}$ applied to the gate and source. This requires special voltage doubler or multiplier circuits on the memory array chip, and results in voltages applied to the transistor that are higher than necessary. Such techniques also are generally not scalable, since device sizes are being increasingly smaller but without concomitant supply voltage reductions. This produces significantly higher fields within the memory transistor and its memory retention dielectric.

SUMMARY OF THE INVENTION

In light of the above, it is, therefore, an object of the invention to provide improved non-volatile dielectric memory cell devices and methods for operating such devices.

It is another object of the invention to provide an improved non-volatile memory cell device that includes a bias circuit that enables a dielectric storage memory cell to be fully scalable, using a single transistor cell.

It is still another object of the invention to provide a method for biasing a non-volatile dielectric storage memory cell that enables a single transistor cell to be addressed without read disturb conditions to the addressed cell as well as the nonaddressed cells in the array.

It is a further object of the invention to provide a memory cell, which utilizes a non-conductive non-volatile storage element having a channel substantially fully self-aligned to a field shield isolation gate.

It is a still further object of the invention to provide a smaller cell size by utilizing field shield isolation.

Yet another object of the invention is to integrate cells into an array by utilizing a diffused bit line beneath a field shield isolation gate.

Yet another object of the invention is to reduce the write voltage and the program and erase currents.

It is yet another object of the invention to provide a novel memory cell architecture and bias scheme.

It is a further object of the invention to provide a memory cell, which utilizes a non-conductive non-volatile storage element having a channel fully self-aligned to its gate.

It is a still further object of the invention to provide a smaller cell size by utilizing field shield isolation only between cells within a row, and not between cells within a column.

Yet another object of the invention is to integrate cells into an array by utilizing a diffused bit line partially beneath a field shield isolation gate.

The above and further objects, details and advantages of the invention will become apparent from the following detailed description, when read in conjunction with the accompanying drawings.

The invention relates to a memory cell to construct an integrated circuit superior to known devices. More particularly, the invention comprises a memory cell that may be constructed as a single transistor non-volatile cell, integrated into a cell array. The memory cell utilizes a non-conductive non-volatile storage layer between the gate and the channel. The non-volatile storage layer may be altered by the application of an electric field or the conduction of current with its accompanying electric field between the gate and the channel regions of the transistor. Such altering of the non-volatile layer may comprise changing the stored charge in the layer, the molecular structure of the layer, or the atomic structure of the layer.

The channel is fully self-aligned to a field shield isolation gate which also enables small cell size to be realized. The non-volatile layer of material can be altered by the application of an electric field or a current with its accompanying electric field between the gate and the channel of the transistor. The non-volatile material may comprise oxides, oxynitrides, silicon rich oxide, silicon nitride, silicon oxynitride, silicon rich silicon dioxide, tantalum pentoxide, carbides, ceramics, aluminum oxide, silicon carbide or ferroelectric materials, or other suitable dielectrics or multilayered dielectrics, such as SNOS, and SONOS.

Thus, according to a broad aspect of the invention, a non-volatile integrated memory circuit and memory array including same are presented. The circuit is formed on a semiconductor substrate, and has a memory transistor having a source, a drain, a gate, and a dielectric memory material. The dielectric memory material has programmable memory states that produce a negative transistor threshold of magnitude less than $V_{cc}$ when the memory transistor is erased and a different threshold when the memory transistor is programmed. A biasing circuit applies selected read biasing voltages to the gate, drain, source, and substrate of the transistor. The read biasing voltages include a supply voltage, $V_{cc}$, applied to the drain, and a read voltage, $V_r$, of magnitude less than supply voltage, applied to the source and gate. A sensing circuit senses a current generated at the drain of the memory transistor in accordance with the programmable state of the dielectric memory material. The biasing circuitry also may apply a reference voltage, $V_{ss}$, to the substrate during a read operation.

The dielectric memory material may be selected from the group comprising oxides, oxynitrides, silicon rich oxide, silicon nitride, silicon oxy-nitride, silicon rich silicon dioxide, tantalum pentoxide, carbides, ceramics, aluminum oxide, silicon carbide and ferroelectric materials, or may be another suitable dielectrics or multilayered dielectrics, such as SNOS, and SONOS.

The read voltage, $V_r$, is selected such that it is of opposite polarity and larger in magnitude than a threshold voltage of the memory transistor after it has been freshly erased, but less than $V_{cc}-V_{ds,sat}$, where $V_{ds,sat}$ is a saturation voltage of the memory transistor.

According to another broad aspect of the invention, a transistor structure is provided in a semiconductor substrate of first conductivity type. The transistor structure has source and drain regions of second conductivity type in the substrate and a channel between the source and drain regions. A first dielectric layer is over the substrate, and a first conducting layer on the first dielectric layer provides a field shield layer over regions away from the channel. The field shield layer overlies at least portions of the source and drain regions, and is substantially self aligned with at least portions of the channel. A second dielectric layer is over at least the channel region, and a second conducting layer over the second dielectric layer extends over the channel, and is patterned to provide a gate for the transistor structure.

The second dielectric may be a multilayer dielectric of non-volatile material, such as a material chosen from the group consisting of oxides, oxynitrides, ferroelectric materials, silicon rich oxide, silicon nitride, silicon oxy-nitride, silicon rich silicon dioxide, tantalum pentoxide, carbides, ceramics, aluminum oxide, and silicon carbide.

According to another broad aspect of the invention, a memory array of addressable MIS transistors arranged in rows and columns is presented. The memory array is formed on a semiconductor substrate of first conductivity type, and has a plurality of substantially parallel bit lines in the substrate. A plurality of channel regions exist in the substrate, each bounded in a direction of current flow by a pair of the bit lines. A first insulation layer is formed over channel regions between at least first alternate sets of the bit lines, and a conductive field shield layer overlies the first insulation layer and is patterned to provide a plurality of electrical regions overlying at least portions of the channel regions between the first alternate sets of the bit lines. The conductive field shield layer preferably is of a first polysilicon level. The field shield layer is configured to expose a plurality of channel regions for the MIS transistors between second alternate sets of the bit lines. Additionally, the conductive field shield layer is biasable to establish nonconducting isolation transistors in the first alternate sets of the bit lines. For example, the field shield layer may be biased to a predetermined potential with respect to the substrate, and in a preferred embodiment, may be biased at the substrate potential. A memory dielectric layer is formed over the channel regions between the second alternate sets of the bit lines, and over a second insulation layer over at least the conductive field shield layer. A conductive gate layer is patterned to provide a plurality of stripes across the second insulation layer and the channel regions of the second alternate sets of the bit lines. Preferably, the conductive gate layer is second polysilicon level.

In one embodiment, the electrical regions patterned from the conductive field shield layer are a plurality of substantially parallel stripes overlying the channel regions between the first alternate sets of the bit lines, and may additionally overlie at least a portion of the bit lines of the first alternate sets of the bit lines. The plurality of stripes of the conductive gate layer are preferably substantially orthogonal to the parallel field shield stripes. In another embodiment, the field shield layer is substantially self aligned with the channel regions of the second alternate sets of bit lines in a direction orthogonal to the direction of current flow in the channels of the memory transistors.

According to yet another broad aspect of the invention, a method is presented for making a memory array of addressable MIS transistors arranged in row and columns. The method includes the step of forming a plurality of conductive bit lines in a substrate of first conductivity type. An electrically conducting field shield layer is formed over at least isolation regions separating source and drain regions of adjacent MIS transistors along each row. The electrically conducting field shield layer is patterned to provide a plurality of gate lines oriented in a first direction covering the isolation regions. A memory dielectric is formed over channel regions of the MIS transistors, and insulation layer is formed at least over the electrically conductive field shield layer. A plurality of substantially parallel MIS transistor common gate lines are formed over the insulation layer and the memory dielectric, oriented in a second direction substantially orthogonal to the first direction.

In one embodiment, the step of patterning the electrically conductive field shield layer comprises patterning the electrically conductive field shield layer in a pattern of substantially parallel stripes in the first direction to cover the isolation regions. In another embodiment, the step of patterning the electrically conductive field shield layer comprises patterning the electrically conductive field shield layer to have portions that are substantially self aligned with portions of the channel regions of the MIS transistors.

The invention results in a non-volatile memory cell and array that has a smaller surface area, has lower program/erase current and power requirements, has more reliability, and has lower vulnerability to radiation than previous devices.

DETAILED DESCRIPTION OF THE PREFERRED EMBODIMENTS

Figure 1:
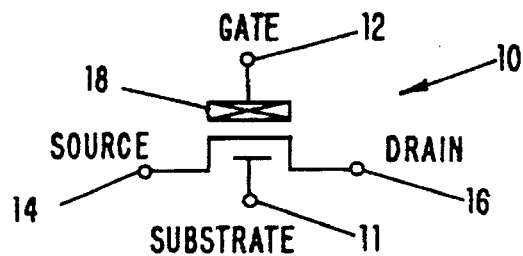
FIG. 1 illustrates a schematic of a single memory cell in accordance with a preferred embodiment of the invention.

As seen in FIG. 1, a schematic of a memory cell 10 that can be used in practicing the invention is illustrated. The memory cell 10 is formed with a single transistor that has a storage layer of non-conducting, non-volatile material between its gate electrode 12 and the transistor channel. Additional non-conducting layers may also be provided between the gate 12 and the channel to form a multi-layer gate dielectric.

The material of the non-volatile gate dielectric is preferably of a type capable of having its properties altered by the application of an electric field or by the conduction of current with its accompanying electric field between the gate and the channel of the transistor, and imparts to the transistor negative thresholds of magnitudes less than $V_{cc}$ by at least $V_{ds,sat}$ in a freshly erased cell. This value is typically at least 1 volt, but is greater than an amount necessary to allow a current flow in the device in a read operation. The properties that may be altered in the material are typically either a stored charge, a molecular structure change, or an atomic structure change. Such non-conducting layers may comprise insulating materials of thicknesses less than 500 angstroms.

Examples of suitable materials of which the non-volatile gate dielectric may be constructed include, but are not limited to, oxides, oxynitrides, silicon rich oxide, silicon nitride, silicon oxy-nitride, silicon rich silicon dioxide, tantalum pentoxide, carbides, ceramics, aluminum oxide, silicon carbide or ferroelectric materials, or other suitable dielectrics or multilayered dielectrics, such as SNOS, and SONOS. These materials have such advantages over other materials that they are generally non-conductive compared to heavily doped silicon; they are capable of being semipermanently altered on a molecular or atomic level by an electric field or current with its accompanying electric field; their retention properties affect the surface potential of the memory cell transistor; they have properties that are stable over a wide range of temperature consistent with commercial semiconductor products; and their alteration property is to the first order reversible.

The change in properties in the above-mentioned materials affects the surface potential of the channel of the transistor to significantly alter the channel conductance under bias. Thus, different levels of conductivity correspond to different logic states. For example, an "on" or conducting state may indicate a logic '0' and an "off" or non-conducting state may indicate a logic '1'. Therefore, by sensing the drain-to-source current under bias, the state of the stored information can be determined. Since the information is stored in a non-volatile form, the information remains stored for a period of time, typically ten years or longer, regardless of whether power is applied to the memory cell 10 or any product containing the memory cell 10.

The memory cell 10 is a single transistor having a diffused source node 14, a diffused drain node 16, a gate node 12, and a substrate node 11. The non-volatile layer 18 is schematically represented as a box with a cross between the gate and the channel to denote the presence of a non-volatile film.

A preferred operation of an N-channel embodiment of a cell in accordance with the invention is summarized in Table 1 below.

| Node | Read | Read Inhibit | Erase | Program | Program Inhibit |
|---|---|---|---|---|---|
| Substrate (P-well) | $V_{ss}$ | $V_{ss}$ | $V_{cc}$ | $V_{pp}$ | $V_{pp}$ |
| Source | $V_r$ | $V_r$ | $V_{cc}$ | $V_{pp}$ | $V_{cc}$ |
| Drain | $V_{cc}$ | $V_{cc}$ | $V_{cc}$ | $V_{pp}$ | $V_{cc}$ |
| Gate | $V_r$ | $V_{ss}$ | $V_{pp}$ | $V_{cc}$ | $V_{cc}$ |

In Table 1, $V_{ss}$ is a reference potential, such as ground or a negative potential with respect to ground, for example $V_r$ less than ground, $V_{cc}$ is a supply voltage, $V_{pp}$ is a programming voltage, and $V_r$ is a read voltage, below described in detail. It should also be noted that the conditions shown in Table 1 are for a N-channel device within a P-well. The device could be adapted to a P-channel device by appropriately changing the bias polarities and interchanging the Erase and Program state condition. For an N-channel device, $V_{ss}$ is a reference potential, such as ground or zero potential, $V_{cc}$ is a positive potential with respect to $V_{ss}$, typically between 3.0 and 6.0 volts, $V_{pp}$ is a negative potential with respect to $V_{cc}$, typically within a range of $V_{ss}$ to −10 volts, and $V_r$ is a positive potential with respect to $V_{ss}$, typically within a range of 1.0 and 3.0 volts.

The cell 10 is read by the application of a voltage difference between the drain 16 and source 14, while the gate 12 is biased positive with respect to the substrate node 11 (or P-well) by an amount $V_r$, with the gate-to-source potential difference remaining zero. The logic state of the cell 10 may be determined by using known sensing circuitry to measure the channel current of cell 10 under the bias conditions described in the prior sentence.

One of the advantages provided by the circuit and method of the invention is that the value of $V_r$ is less than $V_{cc}$. It has been found that by using gate selection on a dielectric cell by bringing the source potential up from the potential of the substrate to a value $V_r$, the device can be deselected by bringing the gate potential from $V_r$ to $V_{ss}$, thereby turning off the source junction, and, consequently, creating no fields between the gate the substrate that may cause a disturb condition. The purpose of $V_r$ is to allow the method or system of reading individual cells in a cell array (best seen in FIG. 2 and Table 2 described hereinafter) without causing a disturb to the cells of the array, and particularly to the addressed cell(s). It should be noted that the read inhibit voltages are applied to the nonaddressed cells to actively deselect the nonaddressed cells, by applying $V_r$ to the sources and $V_{ss}$ to the gates of the transistors of the nonaddressed cells. Again, these voltages turn off the source junction, and, consequently, create no fields between the gate the substrate, reducing or eliminating any disturb conditions.

On the other hand, the upper limit of the magnitude of the value of $V_r$ should be selected to be less than $V_{cc}$, and preferably less than $V_{cc}$- $V_{ds,sat}$, where $V_{ds,sat}$ is the saturation voltage of the device. Since the voltage on the drain of a cell being read is $V_{cc}$, the value of $V_r$ on the source and gate should be selected to still enable sufficient current to flow to be detectable. Moreover, since the erase threshold decreases (becomes more positive) with age, a cell containing older data produces less current when addressed. Thus, the upper limit that can be selected for $V_r$ needs to take end of life conditions into consideration. Thus, preferably, $V_r$ should be selected to be as close to the threshold of a freshly erased cell as possible, which allows sufficient current to flow for reliable sensing at end of life.

In contrast to the cell read operation described above, the cell 10 may be "read inhibited" by setting the gate 12 equal to the potential of the substrate 11 at $V_{ss}$ while the drain 10 and the source 14 are set at the same potentials as used during a read operation, $V_{cc}$ and $V_r$, respectively. This operation is particularly useful when the cell 10 is connected in plurality with cells that share common bit and virtual source lines. In this configuration, one cell can be read while all other cells in parallel are "read inhibited" or deselected. This operation occurs without disturbing the data stored in either the addressed and selected cells or the unaddressed and deselected cells in a read operation.

The selection of an appropriate value of $V_r$ depends on a number of factors related to the threshold voltage of an erased device. More particularly, it is recognized that the threshold voltage of a freshly erased device is larger than that of a device at end of life. End of life is generally regarded to mean a time at which the thresholds of programmed and erased devices decay to predetermined acceptable levels, and is typically on the order of about 10 years.

The range of suitable minimum values for $V_r$ is measured with regard to a freshly erased device, and can be selected to be a value that is of opposite polarity and larger in magnitude than the maximum erase threshold. The erase threshold is used to mean the threshold voltage for reading an erased cell. It will, of course be appreciated that an erase threshold can be established by design, taking into account the choice and thickness of the gate dielectric and non-volatile materials, the size of the memory array, the number of cells that may be contributing to the output sense current, the voltage sensing capabilities of the sensing circuitry, and so forth. Thus, the erase threshold of a device should be such that the state of a single cell can unmistakably be sensed in the particular construction chosen, at any point during the lifetime of the stored data in that cell. So, $V_r$ may be selected to produce a maximum predetermined cell current in a deselected freshly erased cell, which, when summed over all the deselected cells on a common bit line, each being in a freshly erased state, will produce substantially less current than is required by sensing circuitry to correctly sense a program state in a single selected cell.

The cell 10 can be erased by setting the gate 12 potential to a negative value with respect to the channel or substrate. For example, the source 14, drain 16 and P-well 11 are biased at $V_{cc}$ while the gate is biased at $V_{pp}$. These conditions are held typically 10 milliseconds or less. The drain 16 or source 14, but not both simultaneously, could be allowed to "float" to the P-well potential.

In a similar manner, the cell 10 can be programmed by setting the substrate, source 14, and drain 16 to the same $V_{pp}$ potential, while setting the gate 12 potential to a positive value with respect to the channel or source 14. For example, the source 14, drain 16 and P-well 11 are biased at $V_{pp}$ while the gate is biased at $V_{cc}$. Again, the conditions are typically held for 10 milliseconds or less and the drain 16 or source 14, but not both simultaneously, could be allowed to float to the P-well potential.

Another feature of the single cell 10 device is its ability to "program inhibit" the cell 10 as shown in the Program Inhibit column of Table 1. This operation is used when a plurality of cells 10 share a common gate along a row. A single cell 10 along a row can be programmed while the other cells 10 on that row are program inhibited. If their erase state is to be preserved in the cell, then either or both or the source or drain nodes are biased at a voltage no greater than $V_{cc}$, but no less than $$\frac{V_{cc} + V_{pp}}{2}.$$

Thus, in operation, if a selected device is erased, $V_r$ is selected such that current flows in the device when the gate and source potentials are equal to $V_r$ and the drain potential is $V_{cc}$, which is larger than $V_r$. The potential in the erased device channel is between $V_{cc}$ and $V_r$, thus preventing a "disturb" condition by reinforcing the erase state of the dielectric. In a device that is not selected, $V_{ss}$ is applied to the gate; consequently, no or very little current flows while the source is at $V_r$. If an erased device has a negative threshold voltage less than $V_r$ in magnitude, a device with its gate at $V_{ss}$ will be off and there will be no gate to substrate (or channel) field to disturb the non-volatile state.

On the other hand, if the device is programmed and has a positive threshold voltage, no current will flow under the read bias conditions of any of the cells. No channel will form in the programmed device and a voltage drop will occur that reinforces the programmed state, thus preventing a disturb condition. In a read inhibit condition with a programmed positive threshold voltage, a cell with its gate 12 at $V_{ss}$, will be off and the gate to substrate potential will be zero, which also is a non-disturb condition.

The drain 16 to source 14 current may be sensed or measured using any one of known techniques. If the cell 10 is erased, the channel is conductive and current flows from drain 16 to source 14. If cell 10 is programmed, the channel is non-conductive and none to a slight current is present.

Figure 2:
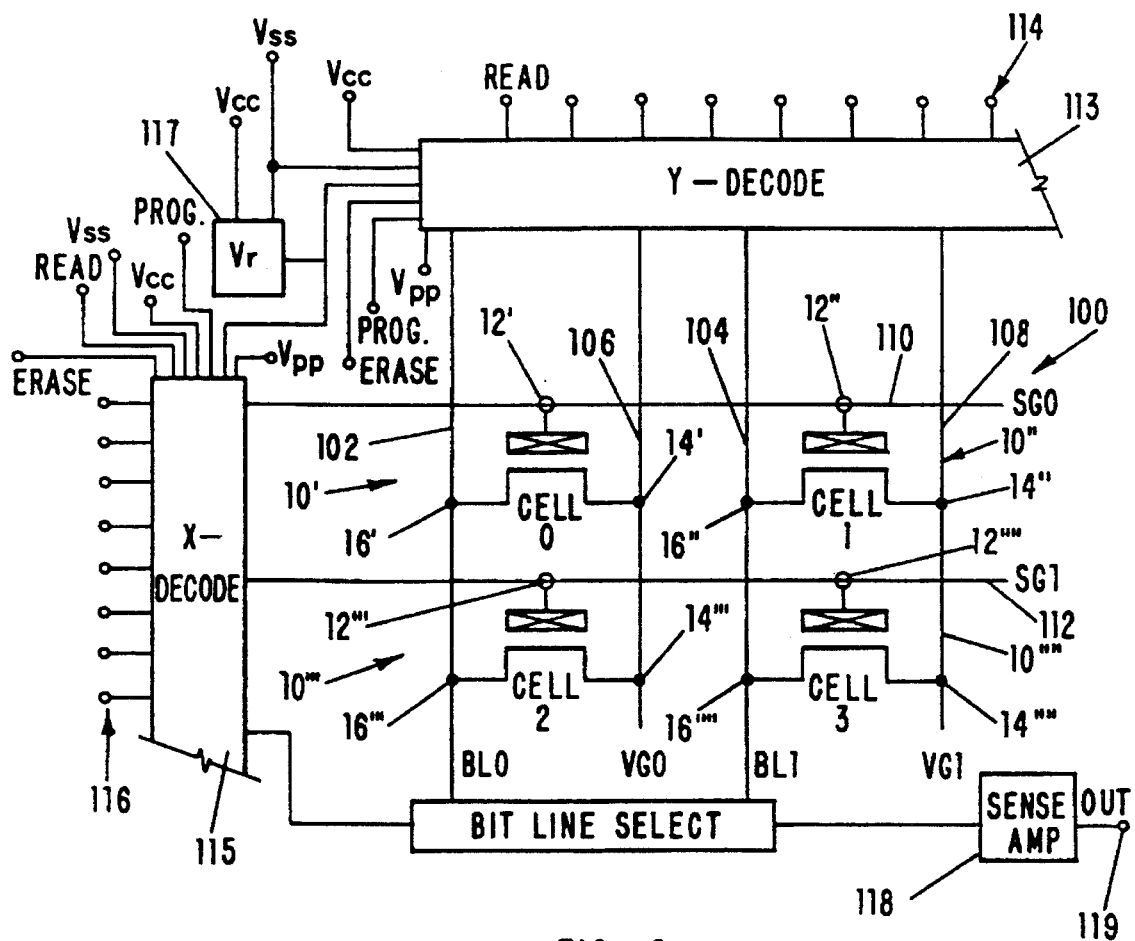
FIG. 2 illustrates a schematic of an array of memory cells in accordance with another preferred embodiment of the invention.

As best seen in FIG. 2, the cell 10 may be arranged in a plurality of columns and rows of identical cells (10', 10", 10''', 10'''') to form a cell array 100 to construct a high density memory product, such as a one or sixteen megabit flash memory device, or the like. The drawings illustrate a 2×2 array 100, but such figures are not intended to limit the number of cells 10 possible in an array 100.

As schematically shown in FIG. 2, the cells 10' and 10''' are connected at the source nodes 14' and 14''' to the virtual ground line 106, designated as VG0; and the source nodes 14'' and 14'''' of cells 10'' and 10'''' are connected to the virtual ground line 108, designated as VG1. Likewise, the drain nodes 16' and 16''' of the cells 10' and 10''' are connected the bit line 102, designated as BL0, and the drain nodes 16'' and 16'''' of the cells 10'' and 10'''' are connected to bit line 104, designated as BL1.

The cells 10' and 10'' share a common gate line 110 (SG0), and cells 10''' and 10'''' share a common gate line 112 (SG1). Simply stated, the drain nodes 16 and source nodes 14 are "shared" among the cells 10 in columns and the gate nodes 12 are "shared" among the cells 10 in rows. Since the source nodes 14 and drain nodes 16 are not "shared" among cells 10 in any row, independent control of source lines is possible, permitting unaddressed cells to be actively deselected for elimination of high currents and "disturbed" cells.

On the other hand, cells 10 with "shared" or common drain nodes 16 and source nodes 14 have separates gate nodes 12 permitting a single addressed cell 10 to be programmed or read. Of course, an entire row of cells 10 can be read, erased or programmed, if desired.

The bit lines BL0, BL1, ... and virtual ground lines VG0, VG1, ... of the individual cells 10'–10'''' are addressed by signals from a Y-decoder 113, which decodes address signals applied to an input address bus 114. In like manner, the gate lines SG0, SG1, ... are addressed by signals from an X-decoder 115, which decodes address signals applied to an input address bus 116. The X- and Y-decoders 115 and 113 each receive a read voltage $V_r$, from source 117, a supply voltage $V_{cc}$, a reference potential $V_{ss}$, and a programming voltage $V_{pp}$, for selective application to the respective bit, virtual ground, gate lines, and substrate of the array 100, as well as read, erase, and program control signals to specify the particular function to be performed and voltage levels to be selected and applied. The construction of the voltage source $V_r$ 117 can be a voltage divider, band gap, or other similar circuit. The control signals and addresses can be applied to the X- and Y-decoders internally or externally from the integrated circuit chip on which the array is constructed, in a manner known in the art. The current produced on the bit lines BL0, BL1, ... is sensed by a sense amplifier 118, for delivery to an output terminal 119. The sense amplifier 118 can be of any known suitable type.

Table 2 below describes a preferred operation of the cell array 100 shown in FIG. 2.

TABLE 2

| Node | Read Cells 0 & 1 Read Inhibit Cells 2 & 3 | Erase Cells 0 & 1 Deselect Cells 2 & 3 | Program Cell 0 Program Inhibit Cell 1 Deselect Cells 2 & 3 |
|---|---|---|---|
| Substrate (P-Well) | $V_{ss}$ | $V_{cc}$ | $V_{pp}$ |
| SG0 | $V_r$ | $V_{pp}$ | $V_{cc}$ |
| SG1 | $V_{ss}$ | $V_{cc}$ | $V_{pp}$ |
| BL0 | $V_{cc}$ | $V_{cc}$ | $V_{pp}$ |
| VG0 | $V_r$ | Float | Float |
| BL1 | $V_{cc}$ | $V_{cc}$ | $V_{cc}$ |
| VG1 | $V_r$ | Float | Float |

The cell array 100 can be read by sensing a current on the bit lines 102, 104 by known sensing techniques. If an erased device has a negative threshold voltage with its gate and source potential at $V_r$, established as described above, the erased device will be on and conducting current.

The cell array 100 enables a read system that allows a selection of individual cells 10 within a column of common cells 10 without causing a "disturb" condition. As described above, a "disturb" condition occurs when an electric field that is at a polarity that changes the state of the cell occurs between a gate and the substrate. A read inhibit bias system allows the active "deselection" of individual unaddressed cells within a column of common cells without causing a "disturb" condition. A program inhibit bias system allows the active "deselection" of individual cells within a row of common cells 10 without causing a "disturb" condition in a cell 10.

A group of cells in the array 100 can be erased by biasing a gate, such as 12' to $V_{pp}$, erasing all of the cells on gate line 110. Since there is no erase inhibit operation for cells sharing a common gate, in distinction to a program inhibit operation, all of the cells that share a common gate are erased simultaneously. By biasing one gate to $V_{pp}$ and either connecting all other nodes to $V_{cc}$ or allowing the other nodes to float, only the cells with $V_{pp}$ on the gate will be erased. The gate-to-channel potential will be zero on all other devices, thus the state in these cells will remain undisturbed. The erase bias conditions are typically established for 10 milliseconds or less.

Program conditions can be established on a common gate, and inhibited in all cells on that common gate except those for which a programmed state is desired. A program condition can be established by biasing the substrate or P-well at $V_{pp}$ and placing a common gate at $V_{cc}$ (such as SG0 on cells 0 and 1). If an erased state is to be preserved in any of the cells on the common gate, then either or both of the source or drain nodes of that cell are biased at an inhibit voltage no greater than $V_{cc}$, but no less than $$\frac{V_{cc} + V_{pp}}{2}$$

(such as in cell 1). With only one of the two at the inhibit voltage, the other node must be allowed to float so that no current flows and the gate-to-channel voltage will be zero. During a program operation, isolation between adjacent cells can be improved with back bias by establishing a P-well 11 bias that is more negative than $V_{pp}$, typically by 0.5 to 2.0 volts. The program bias conditions are typically established for 10 milliseconds or less.

Since the program and program inhibit conditions are selected on a cell-by-cell basis, typical operation of a cell array will involve first erasing all the cells on a given common gate followed by a program or program inhibit operation of all of the same cells. By following this sequence, a byte, page or block of data can be stored by first erasing the data segment then programming the same segment, inhibiting where an erased state is desired. A byte is either eight or sixteen bits along a given row of cells 10, a page is a whole row of cells 10, and a block is a section of the memory array composed of several rows and columns of cells 10. In a block operation, the entire block may be erased at once followed by a sequence of page or byte program operations on the cells within the block, such that each cell is either programmed or left erased by a program inhibit. Such a sequence of operations would be called a "write", a byte write, a page write, or a block write, depending on the data size. Another possibility is to erase an entire block, but program or inhibit within that block as data becomes available for storage at some later time, on a page or byte basis.

Figure 3:
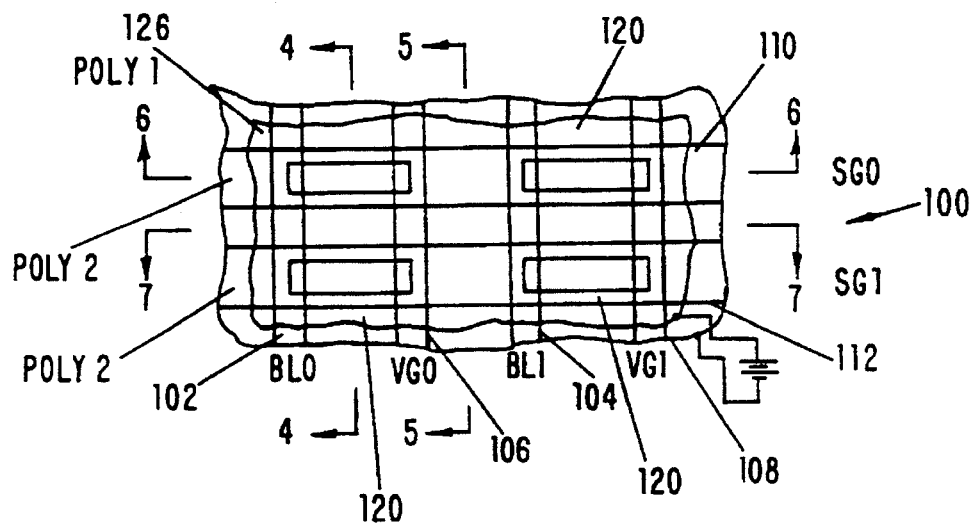
FIG. 3 illustrates a top plan view showing the structural layout of one embodiment of the cell array shown in FIG. 2.

A topographical plan view of a typical cell array 100 that is shown schematically in FIG. 2 is shown in FIG. 3. The cells 10' to 10'''' utilize field shield isolation means to provide isolation between nodes of adjacent cells to reduce cell size. In this embodiment, the gate conductors 110,112 may comprise doped poly-silicon layers. However, conducting materials such as aluminum, refractory metals, or other known conducting materials may be used. The bit lines 102,104 are diffused N+/N− nodes. Isolation is provided by a first polysilicon layer field shield device 126 with a gate held at the potential of the P-well. The memory storage area is shown at 120.

Figure 4:
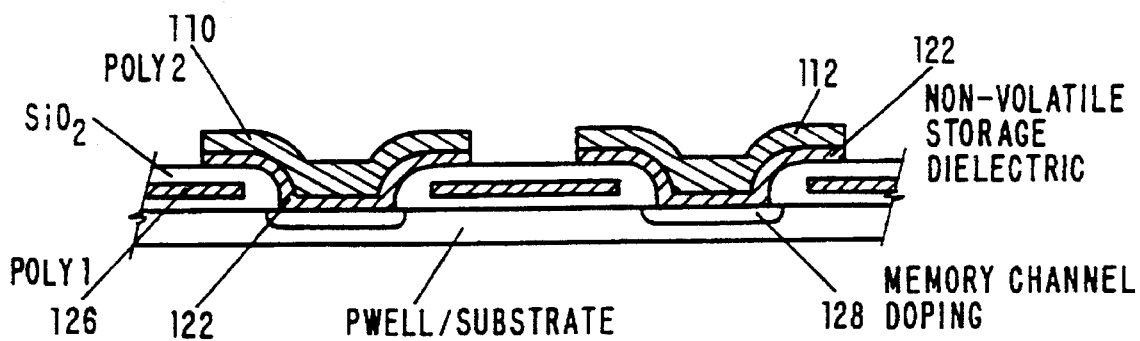
FIG. 4 illustrates a cross-sectional view taken along line 4—4 in FIG. 3.

As seen in FIG. 4, a cross-section taken along the line 4—4 of FIG. 3 illustrates a side view of the array 100. The storage dielectric 122 is shown between the substrate and poly 2 layer 110,112. The field shield 126 is formed from a poly 1 layer. The layer 110,112 and dielectric 122 are self-aligned by the use of a single mask to etch both layers as described later. The field shield 126 separates the memory channel doping areas 128.

Figure 5:
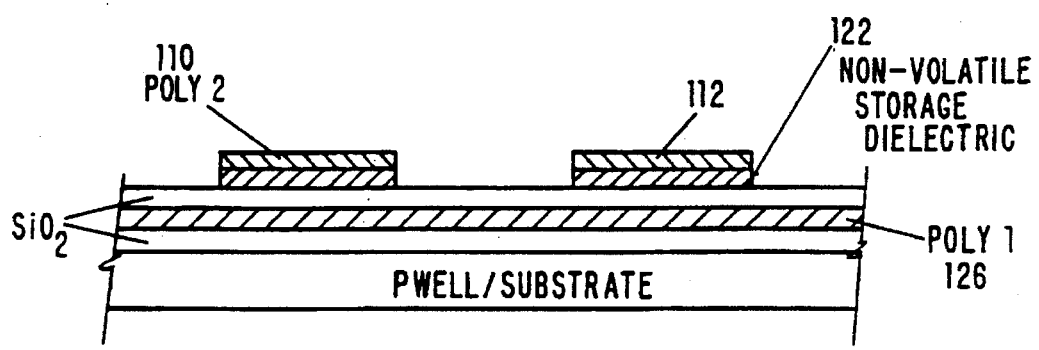
FIG. 5 illustrates a cross-sectional view taken along line 5—5 in FIG. 3.

Shown in FIG. 5 is a cross-section taken along line 5—5 in FIG. 3. The section shows the device between memory areas 120 and the field shield isolation means 126.

Figure 6:
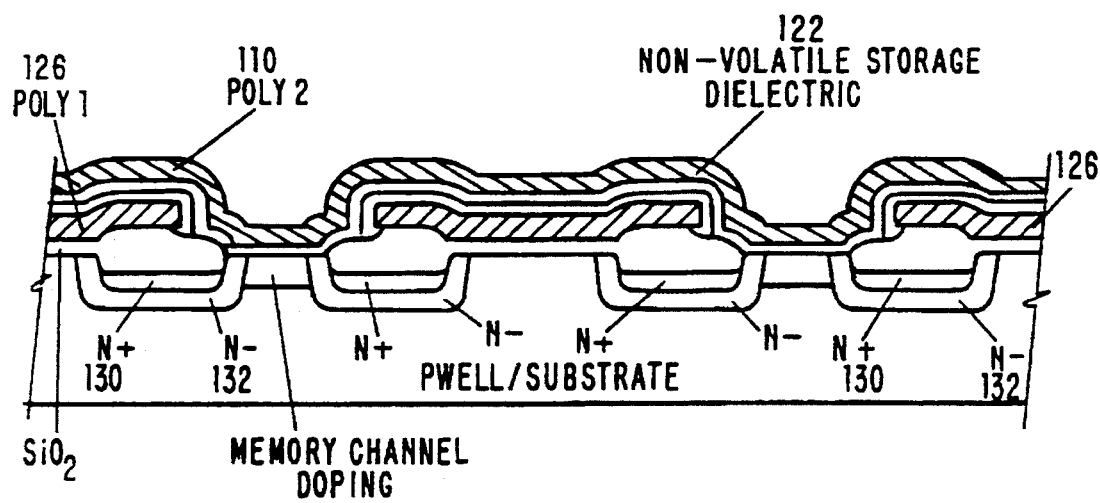
FIG. 6 illustrates a cross-sectional view taken along line 6—6 in FIG. 3.

Shown in FIG. 6 is a cross-section taken along line 6—6 in FIG. 3 showing the device through the memory areas 120. The channel doping 128 is provided in the channel region in this figure. This doping level in the memory channel 128 is chosen to set the average of the program and erase state threshold voltages such that the value of the average of the program and erase state threshold voltages after 10 years (or end of life) is near or slightly below $V_{ss}$.

Figure 7:
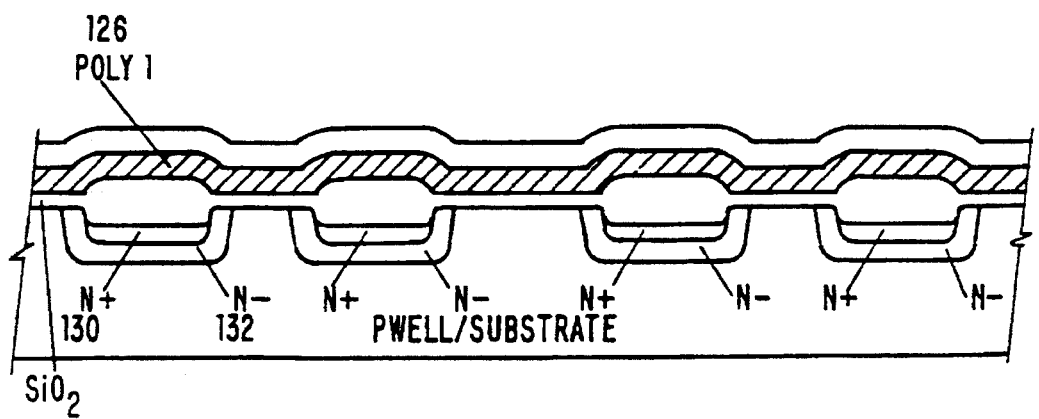
FIG. 7 illustrates a cross-sectional view taken along line 7—7 in FIG. 3.

The implants (N+/N−) 130, 132 are best seen in FIGS. 6 and 7. The N− implant 132 surrounds the N+ 130 by using the same mask as that used for the N+ region 130. The N− region 132 improves the junction breakdown characteristics, improves the endurance of the dielectric 122 and reduces the junction capacitance of the lines 102, 104, 106 and 108. The N+ region 130 provides low sheet resistance along the lines 102, 104, 106 and 108. The N+/N− (130,132) regions are constructed into the substrate before the construction of the field shield 126 so that the bit lines 102,104 and the virtual ground lines 106 and 108 can traverse beneath the poly 1 layer 126.

FIG. 7 illustrates a cross section taken along line 7—7 in FIG. 3 which shows the array 100 cut between memory areas 120. Note that the N+/N− (130,132) forming bit lines 102,104 and virtual ground lines 106 and 108 continue between cells beneath field shield 126.

The cell described above can be constructed using many different processing techniques. One process flow is described here in outline form using a SONOS cell construction. The dielectric is a stack of tunnel oxide grown on the substrate, silicon oxy-nitride deposited on the tunnel oxide, and a deposited layer of silicon dioxide. An N-type starting wafer is assumed. Ranges are supplied for some thicknesses, times and temperatures. These ranges are provided for clarification of function, and not meant to indicate the only acceptable values. Only the processing steps that are required to construct the memory cell are included. Other processing steps that are required for integration with other circuit elements and interconnection can be performed in addition to the steps listed below by using techniques that are commonly known by those skilled in the art of integrated circuit processing.

---

1. P-Well Construction
   Oxidation (100–200 Angstroms)
   P-Well Photomasking Steps
   P-Well Boron Implant
   Photoresist Removal
   P-Well Drive (1000–1200 degrees C., 2 to 12 hours)
2. Bit-line Formation
   Clean (Etch to remove 100–200 Angstroms $SiO_2$)
   Oxidation (100–200 Angstoms)
   Silicon Nitride Deposition (1000–1200 Angstroms)
   Bit-Line Photomasking Steps
   Silicon Nitride Etch (Reactive Plasma Etching)
   N− Implant (Phosphorous 1E14-5E15/$cm^2$)
   N+ Implant (Arsenic 1E15-1E16/$cm^2$)
   Photoresist Removal
   Oxidation (500–2000 Angstroms)
   Silicon Nitride Removal (Hot Phosphoric Acid)
3. Field Shield Formation
   Clean (Etch to remove 100–200 Angstroms)
   Threshold Adjust Implant (Boron 1E11-1E12$cm^2$)
   Gate Oxidation (100–500 Angstroms)
   Poly 1 Deposition (2000–5000 Angstroms)
   Poly Doping ($POCL_3$, 900 Degrees C.)
   Etch (To Bare Poly)
   Oxidation (500–2000 Angstroms)
   Poly 1 Photomasking Steps
   Poly 1 Etch (Reactive Plasma Etch)
   Photoresist Removal
4. Spacer Oxide Formation
   Deposit Conformal CVD Oxide (1000–4000 Angstroms)
   Anisotropic Oxide Etch (Reactive Plasma Etch to Substrate)
   Clean
   Oxidation (100–500 Angstroms)
5. SONOS Cell Construction
   Threshold Implant (Boron or phosphorus 1E11-1E12/$cm^2$)
   Clean (Etch 100–500 Angstroms, Bare Silicon in Cell Channel)
   Tunnel Oxide (0–25 Angstroms)
   Silicon Oxy-Nitride Deposition (10–300 Angstroms)
   Top Oxide Deposition (0–100 Angstroms)
   Poly 2 Depositions (2000–5000 Angstroms)
   Poly 2 Doping (Phosphorus, Ion Implant 1E15-5E16/$cm^2$)
   Implant Anneal (800–900 Degrees C.)
   Poly 2 Photomasking Steps
   SONOS Etch (Reactive Plasma Etch)
   Photoresist Removal

---

Figure 8:
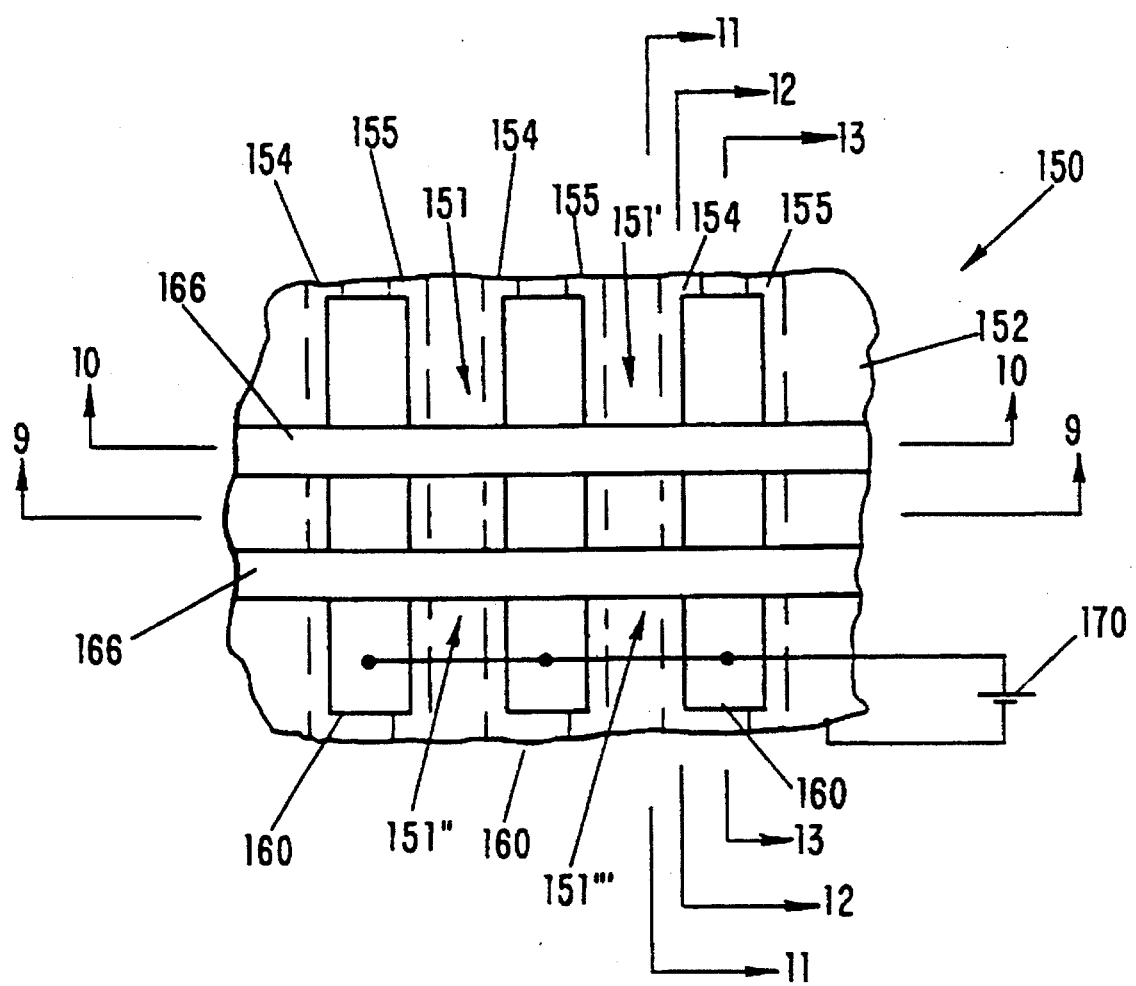
FIG. 8 is a top view plan view showing the structural layout of another embodiment of the cell array in accordance with yet another object of the invention.
Figure 9:
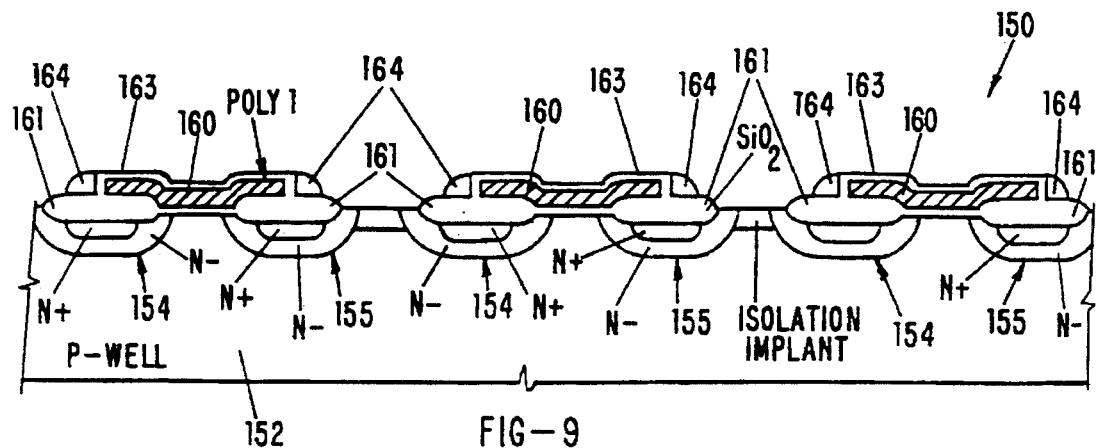
FIG. 9 illustrates a cross-sectional view taken along line 9—9 in FIG. 8.
Figure 10:
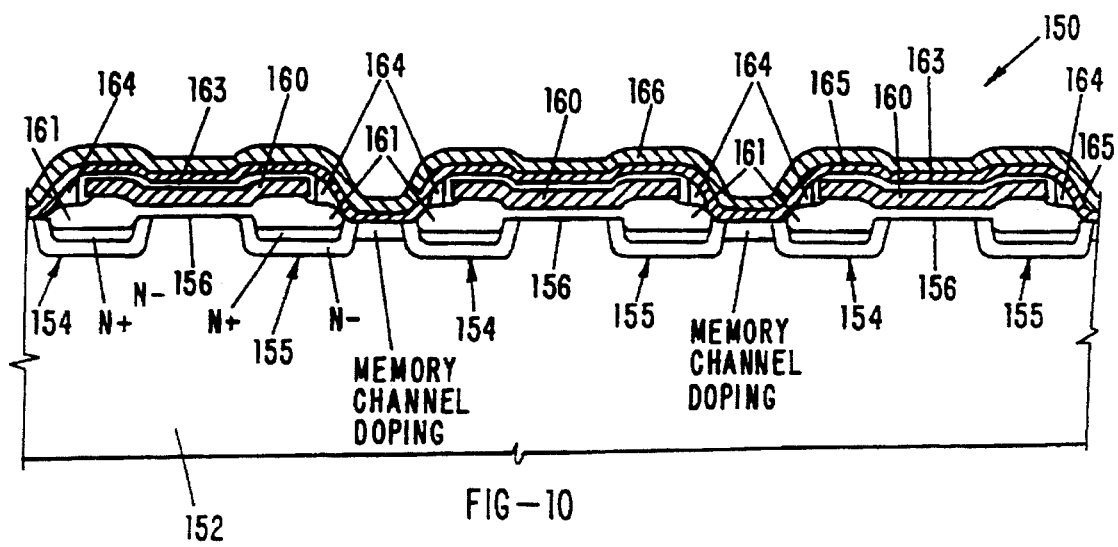
FIG. 10 illustrates a cross-sectional view taken along line 10—10 in FIG. 8.
Figure 11:
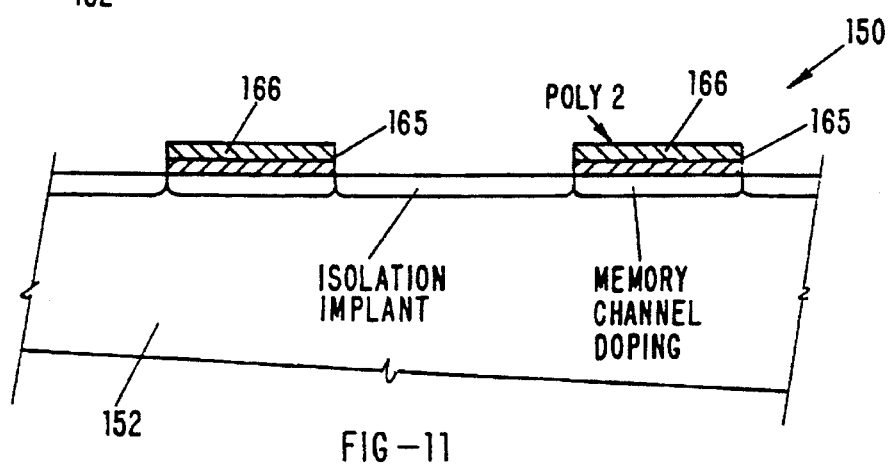
FIG. 11 illustrates a cross-sectional view taken along line 11—11 in FIG. 8.
Figure 12:
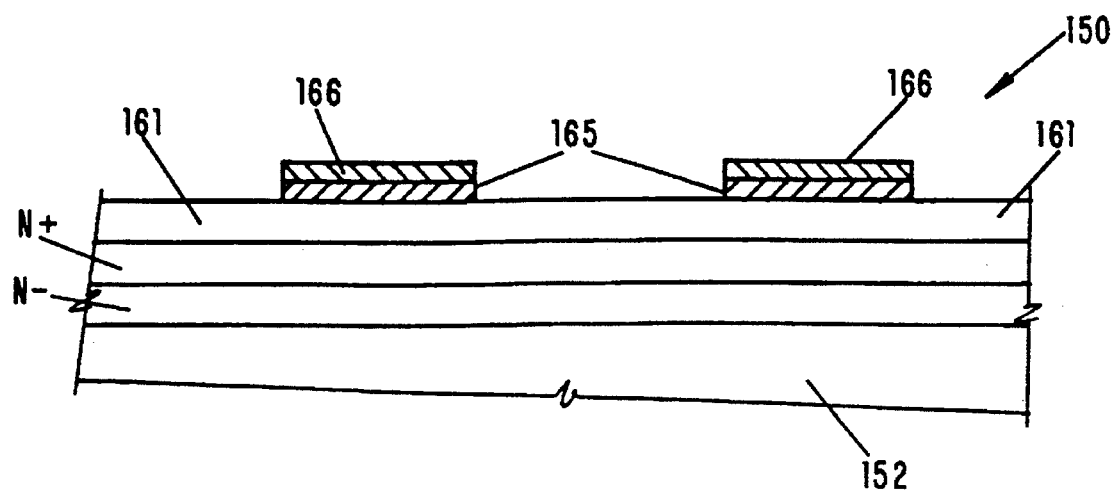
FIG. 12 illustrates a cross-sectional view taken along line 12—12 in FIG. 8.
Figure 13:
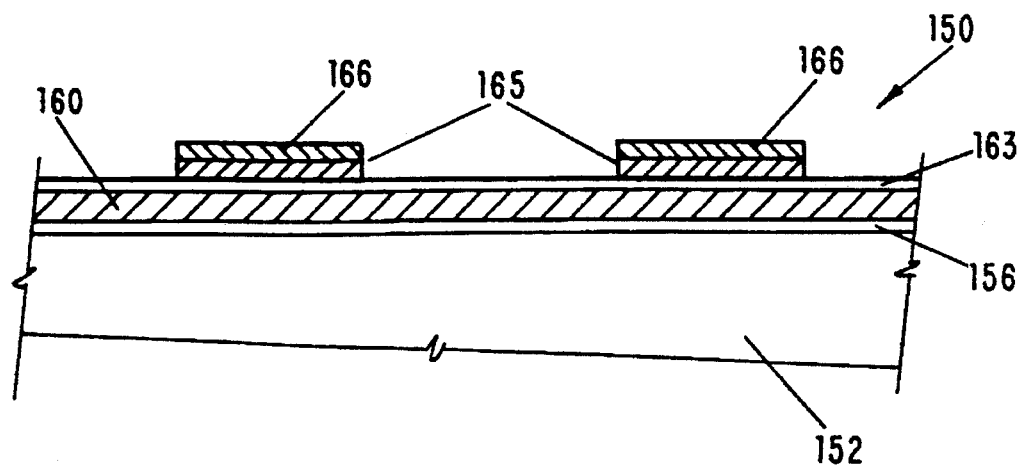
FIG. 13 illustrates a cross-sectional view taken along line 13—13 in FIG. 8.

A topographical plan view of a portion of another embodiment of a structure of a cell array 150 that has an equivalent electrical schematic diagram represented by the circuit of FIG. 2 is shown in FIG. 8. Cross sectional views of the structure of the array 150 taken 9—9, 10—10, 11—11, 12—12, and 13—13 are shown in respective FIGS. 9-13. The portion of the array 150 shown has four memory cells 151 to 151''', each utilizing field shield isolation to provide isolation between adjacent memory devices on the same row. This construction reduces the cell size with respect to the cell array 100 shown in FIG. 3–7. (It should be understood, of course, that although only four cells are shown in the array portion shown, any number of cells can be employed to form an array of desired size, for example, an array of 256 rows ×256 columns to provide a 64K bit memory device.)

The structure 150 is formed on a semiconductor substrate 152, which can be, for example, a p-well formed in a silicon substrate that has been doped with n-type dopant. A plurality of sets of parallel bit lines diffused regions 154 and 155 are formed in the substrate 152 in a stripe pattern to constitute the source and drain elements of the transistors of the array, in a manner below described in detail. Of course, although the source and drain regions 154 and 155 are preferably diffused N+/N− regions formed by known double diffusion techniques, other suitable techniques, such as ion implantation, can be equally advantageously employed. A silicon dioxide ($SiO_2$) layer 161 is formed over the N+/N− regions in a self-aligned manner using the same mask used to form regions 154 and 155.

The regions bounded between the diffused regions 154 and 155 provide the channel regions of the various active and isolation transistors, as below described. The distance between adjacent N+/N− lines in adjacent cells, therefore, determines the channel length of both the active devices and the isolation device between memory cells, so this distance is preferably selected in view of programming and reading bias considerations. Thus, the distance between the pairs of N+/N− diffused lines 154 and 155 can be selected to be equal to or larger than the minimum distance required to achieve (at or below) a maximum allowed leakage current between lines under worst case bias conditions. A layer of insulation 156, for example, of silicon dioxide ($SiO_2$), or other suitable material is then formed overall.

After the oxide layer 156 has been formed on the substrate, a conductive field shield layer is formed and patterned to provide a plurality of stripes 160. The field shield conducting layer 160 is first formed over the entire surface, then a silicon dioxide $SiO_2$ layer 163 is formed over layer 160 by partially oxidizing layer 160 or by deposition. Finally the plurality of stripes 160 with layer 163 on top are patterned and etched. The field shield layer 160 can be formed from a first layer of polysilicon (herein "Poly 1"). The field shield stripes 160 are located over the regions between alternate bit lines 154 and 155, and partially overlie the bit lines 154 and 155 on each side. A sidewall spacer 164 may then be formed, preferably of silicon dioxide $SiO_2$, on the sides of the Poly 1 to reduce the severity of the topography.

It is noted that by virtue of this particular field shield construction, the design tolerance of the Poly 1 level is less than or equal to the design tolerance of the underlying layers, particularly the level in which the bit lines 154 and 155 were fabricated. In fact, the tolerance of the field shield level can be ½ or less than that any of the underlying layers. The purpose of the Poly 1 stripes is to create gates for isolation transistors between alternate rows of memory transistors, using the regions between alternate bit lines as the isolation transistor channels. Thus, the Poly 1 field shield 160 establishes a gate element that can be held at a predetermined potential with respect to the P-well substrate 152. Accordingly, the field shield stripes 160 may be biased by a voltage 170 (which may be zero volts) with respect to the substrate 152 to bias the isolation transistors to maintain them in a nonconducting state. After the Poly 1 field shield stripes have been formed, a channel dopant may be implanted.

A memory dielectric layer 165 (see FIG. 10) is then formed over the entire exposed surface. The memory dielectric layer 165 may have a thickness equal to the desired gate dielectric thickness, and, as before, is preferably a single or multilayer dielectric, such as at least one layer of non-volatile material selected from the group comprising oxides, oxynitrides, ferroelectric materials, silicon rich oxide, silicon nitride, silicon oxy-nitride, silicon rich silicon dioxide, tantalum pentoxide, carbides, ceramics, aluminum oxide, and silicon carbide.

A second conductive layer is then formed and patterned to provide the gate elements 166 thereover, as well as the gate contacting leads for gate connections (not shown) elsewhere on the chip. The gate conductors 166 may be formed of a second doped polysilicon layer (herein "Poly 2"); however, conducting materials such as aluminum, refractory metals, or other known conducting materials alternatively may be used. If desired, the structure may then be completed by known encapsulation techniques, and contacts formed to the various bit line, gate and field shield elements.

The resulting structure is further reduced in size from the structure described above with respect to FIGS. 3–7, the further reduction being enabled, in part, by defining the channel width of the channels of the memory devices by the Poly 2 layer, rather than the by Poly 1 layer. This eliminates or reduces the alignment tolerance of Poly 2 to Poly 1 along the memory cell channels required in the embodiment shown in FIG. 3–7. The layer Poly 2 layer 166 and dielectric 165 are self-aligned by use of a single mask to etch both layers. This makes both the gate and the source/drain junctions substantially self-aligned to the memory channel.

As mentioned, the distance between adjacent N+/N− lines in adjacent cells determines the channel length of the isolation device between memory cells; consequently, this distance is selected under programming bias considerations. During a worst case program operation, when every other cell is being inhibited along a selected row, the voltage between adjacent N+/N− lines in different cells can be as high as $V_{cc}-V_{pp}$, when using a full inhibit bias, or as low as $$\frac{(V_{cc} + V_{pp})}{2}$$

when using a partial inhibit bias. The maximum allowed leakage current generated from such a selected row should be ~10 times less than what can be supplied from the $V_{pp}$ source.

Likewise, the maximum current leakage during a program operation should be sufficiently low as to produce less than a 10% reduction on the inhibit voltage due to resistive voltage drops at the selected cells. These conditions must be analyzed separately for each technology and product array architecture combination in order to choose the appropriate isolation spacing.

This spacing can be further reduced for a given product array architecture by increasing the doping concentration beneath the Poly 1 layer 160, reducing the thickness of the oxide 156 beneath the Poly 1 layer 160, and/or reducing the junction depth of the N+/N− lines 154 and 155. Changes in any one of these three parameters will produce the adverse effect of reducing the breakdown voltage of the N+/N− junction, which in turn increases the leakage current on biased N+/N− lines, so the space cannot be minimized to zero. A minimum isolation space for a given product array architecture can be achieved, however, by adjusting the three parameters to optimally achieve the maximum allowed leakage current.

The distance between adjacent N+/N− lines within the same cell also determines the channel length of the memory device, so this distance is selected under read bias considerations. During a read operation, the maximum allowed leakage current on any column is selected to be ~100 times less than the maximum current that can be sensed as a program state while still achieving product level performance specifications, such as data access time. With this criteria, missensing a program state cell as an erased state cell is avoided. Read mode leakage currents can be minimized between adjacent columns by flipping the orientation of every other N+/N– pair such that source lines are adjacent to sources lines and drain lines are adjacent to drain lines. The leakage current that remains then is between source and drains of deselected cells along each column. The maximum allowed leakage current between lines on a column occurs when all deselected cells on that column are in the freshly erased state. The spacing between N+/N– lines, and thus the channel length of memory devices, are selected to achieve the maximum allowed leakage current described above.

The memory device channel doping and non-volatile dielectric thickness are, for the most part, selected using criteria unrelated to leakage current and so are typically not adjusted to minimize leakage. The N+/N– junction depth can be reduced to minimize the spacing between N+/N– lines; however, such a reduction is limited by junction breakdown, as discussed above. Thus, the distance between N+/N– lines within a column is the first order parameter used to achieve the maximum allowed leakage.

The array 150 described in FIGS. 8 through 13 can be constructed using the same process flow described for the SONOS cell construction with the addition of an additional isolation implant step included as the last step of the SONOS cell construction sequence number 5. The isolation implant step may be of species Boron and dose typically between $5\times10^{11}/cm^2$ and $1\times10^{14}/cm^2$. The isolation implant improves isolation between cells within a column. The isolation implant will be self-aligned to the Poly 2 layer 166 within the memory channel regions.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A non-volatile memory transistor structure in a semiconductor substrate of first conductivity type, comprising:

a first dielectric layer over said substrate;

a first conducting layer to provide a field shield layer on said first dielectric layer, said first conducting layer having a plurality of generally rectangular openings therein to define memory transistor channel regions at the openings, said first conducting layer completely surrounding each of said plurality of generally rectangular openings;

source and drain regions of second conductivity type in said substrate, said source and drain regions extending beneath said first conducting layer between at least two adjacent generally rectangular openings, each of said source and drain regions having a portion extending into the area beneath one of said at least two generally rectangular openings, the portions of said source and drain regions being spaced from each other in said area to define a channel region in said area, said channel region being bounded by the facing sides of said portions of said source and drain regions and the boundaries of said one of said openings;

a second dielectric layer including a non-volatile material over at least said channel; and a second conducting layer over said second dielectric layer, extending over said channel, and being patterned to provide a gate extending generally orthogonal to the direction of extent of said source and drain regions.

2. The transistor structure described in claim 1 wherein said second dielectric is a multilayer dielectric.

3. The transistor structure described in claim 1 in which said non-volatile material is selected from the group comprising oxides, oxynitrides, ferroelectric materials, silicon rich oxide, silicon nitrides, silicon oxy-nitride, silicon rich silicon dioxide, tantalum pentoxide, carbides, ceramics, aluminum oxides, and silicon carbides.

4. A memory array of addressable MIS transistors arranged in rows and columns, comprising:

a semiconductor substrate of first conductivity type;

a plurality of substantially parallel source and drain regions of a second conductivity type in said substrate;

a plurality of channel regions in said substrate, each bounded in a direction of current flow by a pair of said source and drain regions;

a first insulation layer over said substrate;

a conductive field shield layer overlying said first insulation layer and patterned to provide a plurality of electrical regions overlying at least portions of the channel regions between first alternate sets of said source and drain regions, said field shield layer having a plurality of generally rectangular openings therein between said first alternate sets of said source and drain regions to define MIS transistor channel regions at the openings, said conductive field shield layer completely surrounding each of said plurality of generally rectangular openings and extending over channel regions between second alternate sets of said source and drain regions, said conductive field shield layer being biasable to establish nonconducting isolation transistors with said channel regions between said first and second alternate sets of said source and drain regions over which said field shield extends;

said source and drain regions extending beneath said conductive field shield layer between at least two adjacent generally rectangular openings, each of said source and drain regions having a portion extending into the area beneath one of said at least two generally rectangular openings, said MIS transistor channel regions being bounded by the facing sides of said portions of said source and drain regions and the boundaries of said one of said openings;

a second insulation layer over at least said conductive field shield layer;

a memory dielectric layer over at least the MIS transistor channel regions; and a conductive gate layer, patterned to provide a plurality of stripes across the second insulation layer and the MIS transistor channel regions and oriented substantially orthogonal to said source and drain regions.

5. The memory array of claim 4 further comprising means for biasing the field shield layer to a predetermined potential with respect to the substrate.

6. The memory array of claim 4 wherein said predetermined potential is the potential of the substrate.

7. The memory array of claim 4 wherein said plurality of source and drain regions are doped regions in said substrate.

8. The memory array of claim 4 wherein said plurality of source and drain regions are double doped regions in said substrate.

9. The memory array of claim 4 wherein said conductive field shield layer is first level polysilicon.

10. The memory array of claim 4 wherein said conductive gate layer is second level polysilicon.

11. The memory array of claim 4 wherein said plurality of source and drain regions are substantially equidistantly spaced from one another.

12. The memory array of claim 4 wherein said memory dielectric is of a non-volatile material.

13. The memory array of claim 12 wherein said memory dielectric is selected from the group comprising oxides, oxynitrides, ferroelectric materials, silicon rich oxide, silicon nitride, silicon oxy-nitride, silicon rich silicon dioxide, tantalum pentoxide, carbides, ceramics, aluminum oxide, and silicon carbide.

14. The memory array of claim 4 wherein said memory dielectric comprises a multilayer dielectric.

15. The memory array of claim 14 wherein said multilayer memory dielectric includes at least one layer of non-volatile material selected from the group comprising oxides, oxynitrides, ferroelectric materials, silicon rich oxide, silicon nitride, silicon oxy-nitride, silicon rich silicon dioxide, tantalum pentoxide, carbides, ceramics, aluminum oxide, and silicon carbide.

16. The transistor structure of claim 1 wherein said first conducting layer is a first layer of polysilicon.

17. The transistor structure of claim 16 wherein said second conducting layer is a second layer of polysilicon.

18. The transistor structure of claim 1 wherein said source and drain regions are doped regions in said substrate.

19. The transistor structure of claim 18 wherein said source and drain regions are double doped regions in said substrate.

20. The transistor structure of claim 18 wherein said source and drain regions are N+/N− doped regions in said substrate.

21. The transistor structure of claim 1 wherein said channel region has a doping level sufficient to establish average program and erase state voltages.

22. The transistor structure of claim 1 wherein said channel region has a doping level sufficient to establish average program and erase state voltages that are about $V_{ss}$ at an end of life of the transistor structure.

* * * * *